United States Patent [19]
Handa et al.

[11] Patent Number: 5,862,165
[45] Date of Patent: Jan. 19, 1999

[54] VARIABLE WAVELENGTH LIGHT SOURCE USING A LASER, WAVELENGTH CONTROL METHOD, OPTICAL COMMUNICATION SYSTEM AND OPTICAL COMMUNICATION METHOD

[75] Inventors: Yuichi Handa, Atsugi; Masao Majima, Isehara; Jun Nitta, Tokyo, all of Japan

[73] Assignee: Canon Kabushiki Kaisha, Tokyo, Japan

[21] Appl. No.: 705,297

[22] Filed: Aug. 29, 1996

[30] Foreign Application Priority Data

Aug. 30, 1995 [JP] Japan .................................... 7-245439
Nov. 17, 1995 [JP] Japan .................................... 7-324048
Aug. 17, 1996 [JP] Japan .................................... 8-234769

[51] Int. Cl.$^6$ ...................................................... H01S 3/10
[52] U.S. Cl. .............................. 372/27; 372/20; 372/32; 372/33; 372/6; 372/26; 372/45; 372/46; 372/38
[58] Field of Search ................................. 372/23, 32, 28, 372/6, 9, 19, 27, 26, 102, 45, 46, 33; 356/73.1; 373/38

[56] References Cited

U.S. PATENT DOCUMENTS

| | | | |
|---|---|---|---|
| 4,575,849 | 3/1986 | Chun | 372/9 |
| 4,698,816 | 10/1987 | Chun | 372/19 |
| 4,750,833 | 6/1988 | Jones | 356/73.1 |
| 5,107,512 | 4/1992 | Shibutani | 372/27 |
| 5,361,268 | 11/1994 | Fossey et al. | 372/27 |
| 5,544,183 | 8/1996 | Takeda | 372/32 |

FOREIGN PATENT DOCUMENTS

| | | |
|---|---|---|
| 0361151 | 4/1990 | European Pat. Off. . |
| 0657975 | 6/1995 | European Pat. Off. . |
| 0673127 | 9/1995 | European Pat. Off. . |
| 5-190958 | 7/1993 | Japan . |
| 7-162088 | 6/1995 | Japan . |

OTHER PUBLICATIONS

Patent Abstracts of Japan, vol. 17, No. 615, published Nov. 12, 1993, English Abstract of Japanese Patent No. JP 05-190958A.
Patent Abstracts of Japan, vol. 14, No. 414, published Sep. 7, 1990, English Abstract of Japanese Patent No. JP 02-159781A.
Patent Abstracts of Japan, vol. 11, No. 376, published Dec. 8, 1987, English Abstract of Japanese Patent No. JP 62-1444426A.

Primary Examiner—Leon Scott, Jr.
Attorney, Agent, or Firm—Fitzpatrick, Cella, Harper & Scinto

[57] ABSTRACT

A variable wavelength light source is provided with a laser of which the oscillating state can be changed over between two oscillating states accompanied by a change of an oscillation wavelength, and an optical selection element for selecting an output light in one of the two oscillating states of the laser. The optical selection element is capable of changing over which of the output lights in the two oscillating states of the laser is to be selected. Also, by using a laser in which the oscillation wavelength in the respective oscillating states can be changed, the wavelength variation ranges in the both oscillating states can be used.

15 Claims, 13 Drawing Sheets

DRIVE SIGNAL

LIGHT OUTPUT (TE COMPONENT $\lambda_{TE}$)

LIGHT OUTPUT (TM COMPONENT $\lambda_{TM}$)

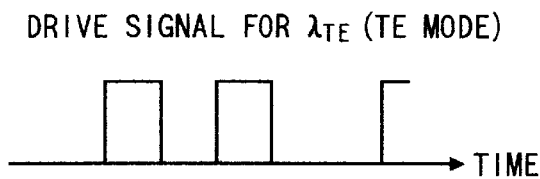
FIG. 5A
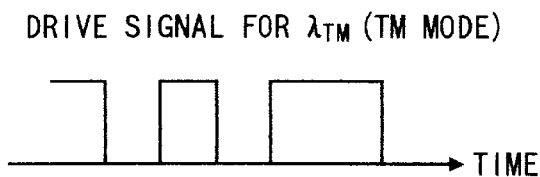
FIG. 5B
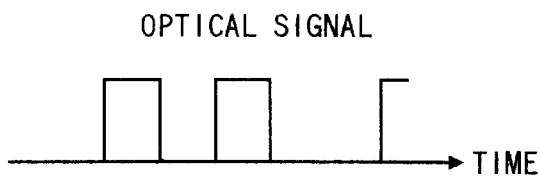
FIG. 5C
FIG. 6
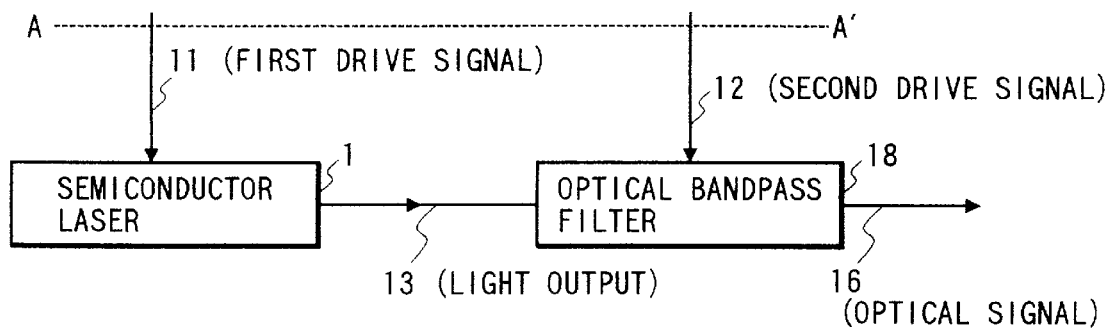

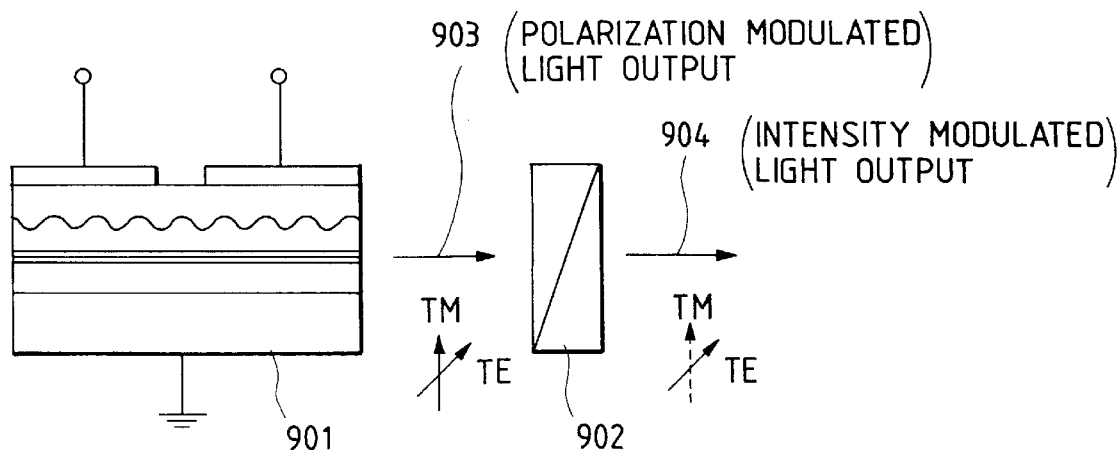
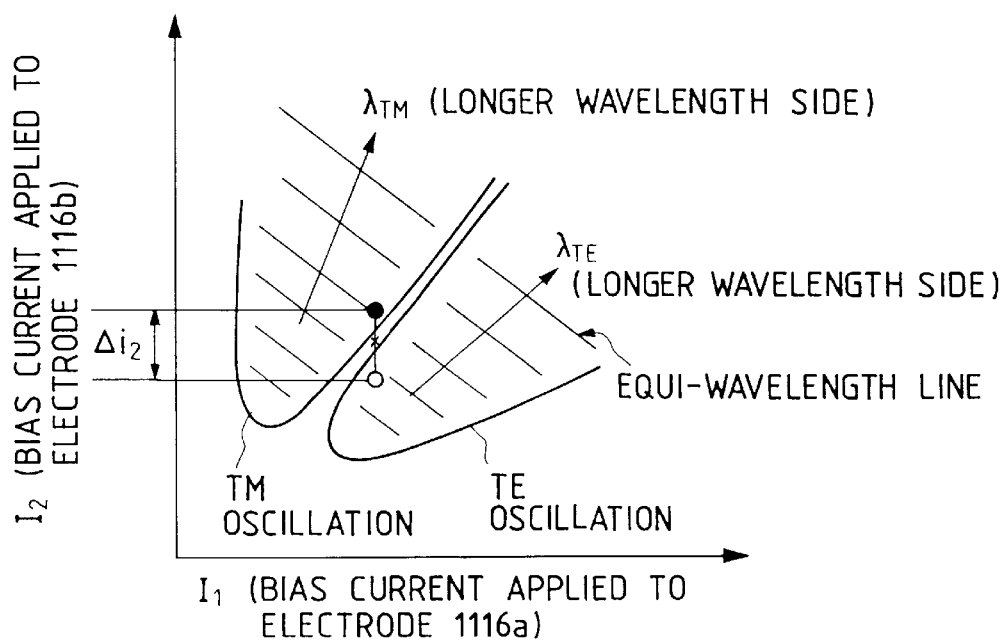

VARIABLE WAVELENGTH LIGHT SOURCE USING A LASER, WAVELENGTH CONTROL METHOD, OPTICAL COMMUNICATION SYSTEM AND OPTICAL COMMUNICATION METHOD

BACKGROUND OF THE INVENTION

1. Field of the Invention

This invention relates to a wavelength multiplex light source and a wavelength control method for use in wavelength multiplex communication or the like.

2. Related Background Art

As a wavelength change-over apparatus, there is known one as described in Japanese Laid-Open Patent Application No. 5-190958 wherein a plurality of light sources are used and by an optical switch, a light output may be taken out of one of the light sources to thereby effect wavelength change-over.

FIG. 1 of the accompanying drawings shows a diagram for illustrating an example of the prior art. Reference numerals 101 and 102 designate light sources, reference numeral 103 denotes an optical switch for selecting and outputting light from one light source 101 or 102, reference numeral 104 designates a modulator for modulating the light from the optical switch 103 in accordance with a signal, reference numerals 105 and 106 denote wavelength stabilizing devices, and reference numeral 107 designate a control device for controlling the wavelength stabilizing devices 105, 106 and the optical switch 103. The light sources 101 and 102 have their wavelengths set and stabilized by the wavelength stabilizing devices 105 and 106. In such a construction, one light source 101 or 102 has been selected by the optical switch and used and in the meantime, the setting and stabilization of the wavelength of the other light source 102 or 101 could be effected.

In the above-described example of the prior art, however, one light source is required for one wavelength and it is necessary to use two light sources for the change-over of two wavelengths.

Also, as light sources used for wavelength division multiplexing transmission, there are known a so-called distributed feedback type semiconductor lasers (DFB-LD) in which an oscillation spectrum is stable and the expanse (line width) of the spectrum during modulation is small so that it can be made highly densely multiplex. In these DFB-LDS, the structure of an oscillator is made into a multielectrode and the gain and phase can be controlled to make the transmitted wavelength variable. By making the most of this variable wavelength characteristic, the channels of multiplex wavelengths which have heretofore been fixed can be freely selected and more flexible optical transmission can be realized. Therefore, this becomes effective for multiplex wavelength transmission for optical LAN in which high speed video signals are mutually exchanged.

In the above-described example of the prior art, however, the wavelength variation width is limited to the order of 1 nm and in the direct modulation of DFB-LD, the expanse of the spectrum during modulation is of the order of 0.2–0.3 nm as compared with a Fabry-Perot type laser, and this has led to the problem that the substantial number of multiplex wavelengths is limited to three to four wavelengths. Besides DFB-LD, an attempt to make the grating period non-uniform and make the wavelength variation width into a wide band has also been reported, but this has suffered from the problem that the element becomes bulky and the structure becomes complicated. Also, as a construction for suppressing the expanse of the spectrum during modulation, there have been reported several examples of the trial manufacture of an optical integrated device in which modulators are integrated in a continuously oscillated DFB-LD, but these have suffered from the disadvantage that a high degree of integration process is required and the yield becomes poor.

SUMMARY OF THE INVENTION

In view of the above-noted problems peculiar to the prior art, the present invention has as an object thereof to provide a novel construction which can effect the change-over of wavelengths by the use of a single laser. The present invention also has as an object thereof to provide a light source of which the wavelength variation range is widened by the use of such a construction.

According to the present invention, to achieve the above objects, a light source is providing comprising:

a variable wavelength light source comprising:

a laser of which the oscillating state can be changed over between two oscillating states accompanied by a change in an oscillation wavelength; and an optical selection element for selecting the output light in one of the two oscillating states of said laser, the optical selection element being capable of changing over which of the output lights in the two oscillating states of said laser is to be selected.

By this construction, the light source can be used with at least two wavelengths changed over by a single laser.

The two oscillating states in the laser can assume two different polarization modes. Specifically, use can be made of TE mode and TM mode which are two polarization modes orthogonal to each other.

When the two different polarization modes are used as the two oscillating states in the laser, the optical selection element can assume a construction having a polarizer for selecting the output light of one of the polarization modes of the output lights of said laser. Means for changing over the output light of the laser selected at that time can assume a construction having a rotating mechanism for rotating the polarizer. Also, the function of the selection can be realized by an ordinary isolator of the polarization dependency type (combined construction of a polarizer, a Faraday rotator and an analyzer), and the change-over of the output light to be selected can be realized by the rotation of the isolator.

Also, when the two different polarization modes are used as the two oscillating states in the laser, the optical selection element has means for selecting one of the two polarization modes, and this variable wavelength light source can assume a construction having polarization control means for making the polarized state of the output light selected or to be selected by the selecting means into a predetermined state. When the polarized state is to be made into the predetermined state at this time after the selecting means has selected, the polarized state of the selected output light resulting from the change-over of the polarization mode to be selected is made into the predetermined state. On the other hand, when the polarized state is to be made into the predetermined state before the selecting means selects, said polarization control means can serve also as means for changing over the polarization mode. Specifically, it is a construction in which an element such as a Faraday rotator and a polarizer fixed in a predetermined direction are arranged, and the change-over of the output light to be selected is effected by controlling the Faraday rotation angle by the use of a magnetic field.

Also, the optical selection element can assume a construction having take-out means for taking out the output lights in the two oscillating states, and an optical switch for selecting one of the taken-out output lights in the two oscillating states. In this construction, high-speed change-over can be realized by using the optical switch.

Also, the optical selection element can assume a construction having a wavelength filter. This construction is also applicable when a laser capable of changing over the polarization mode is used as the laser as described above. Incidentally, as a laser capable of changing over the polarization mode, use can be made of one shown in Japanese Laid-Open Patent Application No. 7-162088. Generally, by the polarization mode being changed over, the oscillation wavelength is also changed over. Also, when use is made of a laser of which the oscillating state not accompanied by a change of the polarization mode can be changed, a construction using this wavelength filter is suitable. As such a laser, there is a laser capable of effecting FSK (frequency shift keying) modulation using a DFB-LD.

Also, as the laser, use can be made of one of which the oscillation wavelengths in the two oscillating states can be varied. At this time, the oscillation wavelengths in the two oscillating states differ from each other and therefore, use can be made of wavelengths of respective wavelength variation ranges by the change-over of the output light to be selected, and a wide wavelength variation area can be obtained as a whole. At this time, it is preferable that the wavelength variation ranges in the two oscillating states be of the same degree as the oscillation wavelength difference between the two oscillating states.

Also, the laser can be designed to be modulated by changing over the oscillating state between the two oscillating states. In this case, the output lights by the two oscillating states are outputted not at a time but always, and this is preferable. As such a modulation system, there are polarization modulation in which the above-described polarization mode is changed over and FSK modulation in which the oscillation wavelength is changed over. If at this time, polarization modulation is adopted, it is easy to take the oscillation wavelength difference between the two oscillating states relatively greatly by the polarization dispersion of Bragg wavelength, and this is preferable.

Also, when the laser is modulated with the oscillating state changed over between the two oscillating states as described above, it owes to the fact that the phases differ from each other depending on the selected output light. Therefore, if the light source has a drive circuit for supplying a modulation signal for the modulation to the laser and the drive circuit is designed to control the phase of the modulation signal in conformity with the output light in the oscillating state selected by the optical selection elements, it is preferable. More specifically, control can be effected so that the phase of the modulation signal when the optical selection element selects one of the output lights in the two oscillating states and the phase of the modulation signal when the optical selection element selects the other of the output lights in the two oscillating states may be opposite to each other.

Also, even when the laser is modulated with the oscillating state changed over between the two oscillating states as described above and the phase of the modulation signal is not controlled depending on which of the output lights is selected, the quantities of light of the respective output lights in the two oscillating states within a time corresponding to one pulse thereof can be designed to differ from each other to thereby discriminate which of the output lights the transmitting side selects, by the quantities of light on the receiving side. When it is difficult to detect the quantity of light of one pulse alone, it is possible to detect the quantities light within a time longer than one pulse and discriminate by the average quantity of light, or to discriminate by the total quantity of light within a predetermined time longer than one pulse. Also, in that case, it is preferable for the transmitting side to send a preamble signal for the discrimination.

To make the quantities of light of the respective output lights in the two oscillating states within a time corresponding to one pulse thereof differ from each other, the design of the device can be made such that the pulse widths of the respective output lights in the two oscillating states differ from each other. This is effective when the powers of the respective output lights in the two oscillating states are substantially of the same degree. When the powers of the respective output lights in the two oscillating states differ greatly from each other, it is also possible to discriminate on the receiving side by itself, and the pulse widths may be determined with the power difference taken into account.

Also, a semiconductor laser is suitably used as the laser. Generally, a semiconductor laser is made to have multiple electrodes and a carrier injected into at least one electrode is modulated, whereby polarization modulation and optical frequency modulation become possible and also, a bias current is controlled (in particular, the ratio of bias currents injected into a plurality of electrodes is controlled), whereby the wavelength of the output light thereof can be made variable. Also, as the laser, use can be made of one having a distributed reflecting structure such as a diffraction grating to thereby suppress the expanse of spectrum, and this is preferable. In optical frequency modulation and polarization modulation, particularly the expanse of the spectrum during modulation is small, and this is very preferable. As a laser having a distributed reflecting structure, use can specifically be made of a distributed feedback type semiconductor laser provided with a distributed reflecting structure near the activated area of the laser, or a distributed reflecting type semiconductor laser provided with a distributed reflecting structure discretely from (in series with) an activated area.

The present invention also provides a wavelength control method by the variable wavelength light source as described above, an optical communication system using the variable wavelength light source as described above, and an optical communication method in said optical communication system.

BRIEF DESCRIPTION OF THE DRAWINGS

FIGS. 5A to 5C illustrate the operation or the driving method of the semiconductor laser in FIG. 3.

FIG. 6 shows the construction of a second embodiment of the present invention.

FIG. 9 shows the basic construction of a fourth embodiment of the present invention.

FIG. 10 is a graph representing the current bias and oscillation characteristic of a polarization modulation semiconductor laser used in the present invention.

DESCRIPTION OF THE PREFERRED EMBODIMENTS

Figure 1:
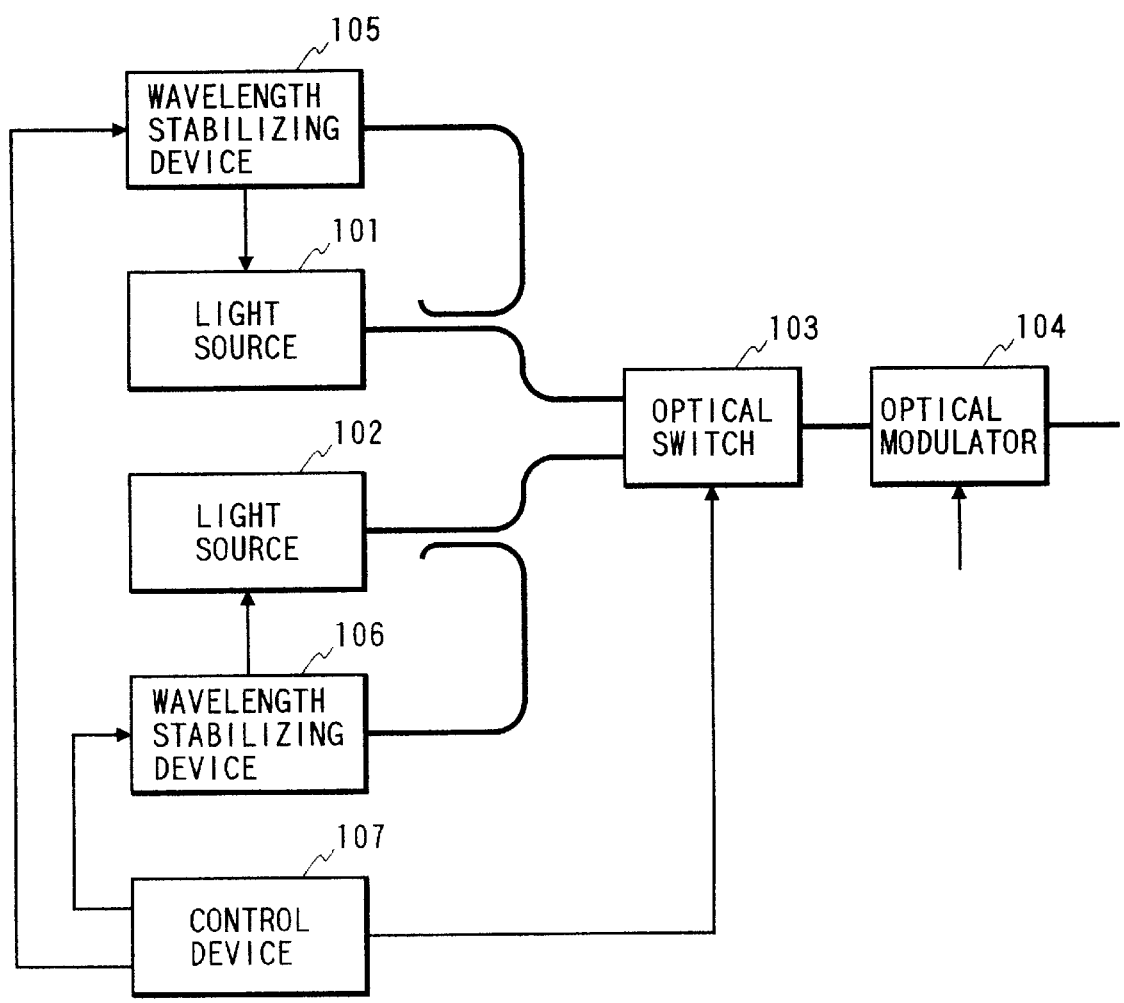
FIG. 1 is a block diagram for illustrating an example of the prior art.
Figure 2:
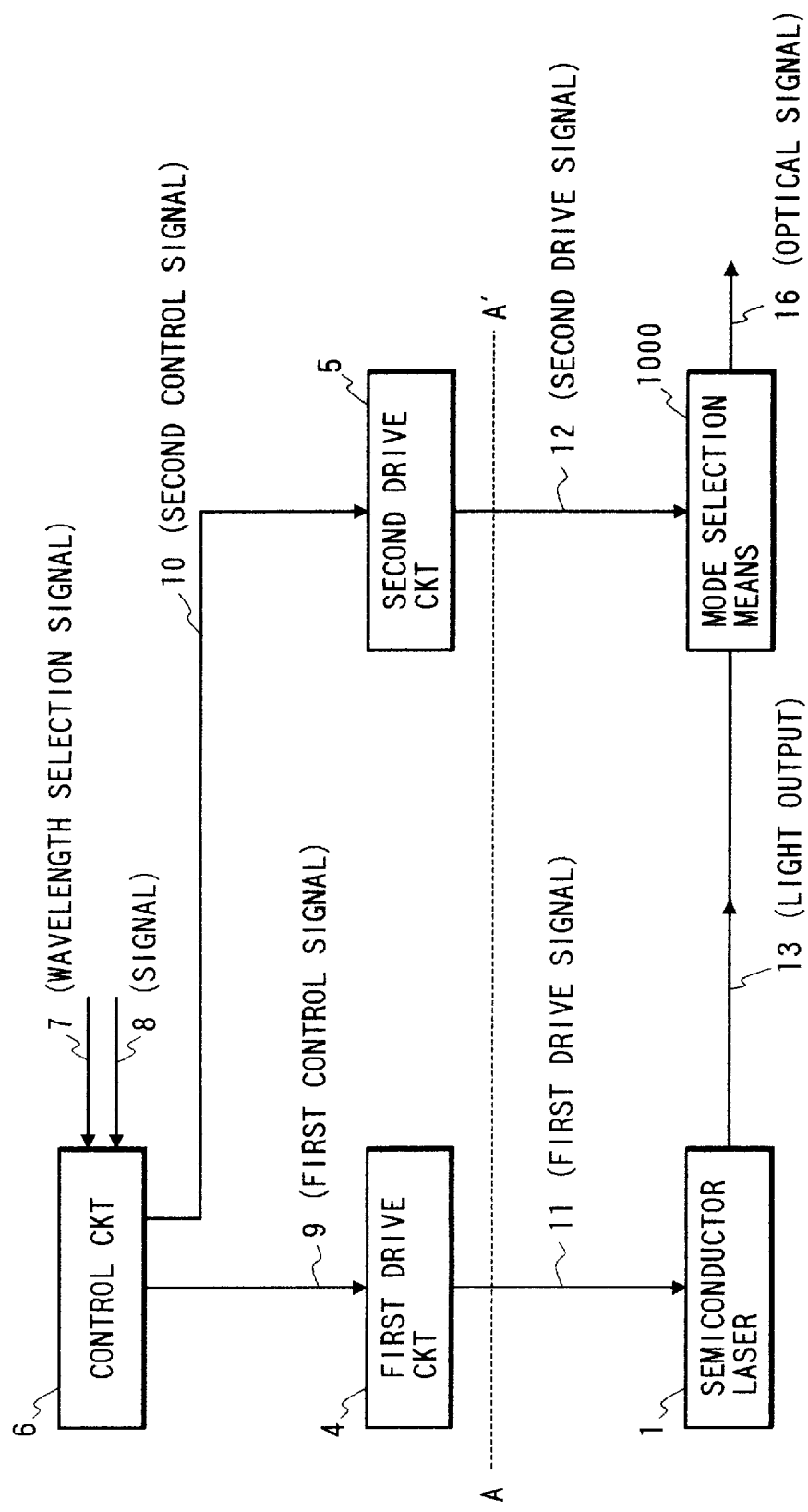
FIG. 2 is a block diagram showing the conceptional construction of the variable wavelength light source of the present invention.

FIG. 2 is a diagram representing the concept of the present invention best. In FIG. 2, reference numerals 1 designates a semiconductor laser (which, as will be described later, may be any polarization modulation laser which has such performance that the polarization of the output light thereof is TE or TM depending on the excited state thereof and of which the wavelength varies at that time), reference numeral 1000 denotes mode selection means, reference numeral 4 designates a first drive circuit for driving the semiconductor laser 1, reference numeral 5 denotes a second drive circuit for driving the mode selection means 1000, reference numeral 6 designates a control circuit for controlling the first drive circuit 4 and the second drive circuit 5 in accordance with signals 7 and 8 from the outside, reference numeral 7 denotes a wavelength selection signal, reference numeral 8 designates a signal, reference numeral 9 denotes a first control signal to the first drive circuit 4, reference numeral 10 designates a second control signal to the second drive circuit 5, reference numeral 11 denotes a first drive signal to the electrode or the like of the semiconductor laser 1, reference numeral 12 designates a second drive signal to the mode selection means 1000, reference numeral 13 denotes the light output of the semiconductor laser 1, and reference numeral 16 designates an optical signal of any one of polarized state and wavelength.

First Embodiment

A first embodiment of the invention will now be described. The mode selection means 1000 used in this embodiment is polarization mode selection means which selects one of the two polarized lights of the output light of the semiconductor laser 1 and makes it into the optical signal 16. As a specific construction, it can be constructed by the use of polarizing split means and an optical switch.

Figure 3:
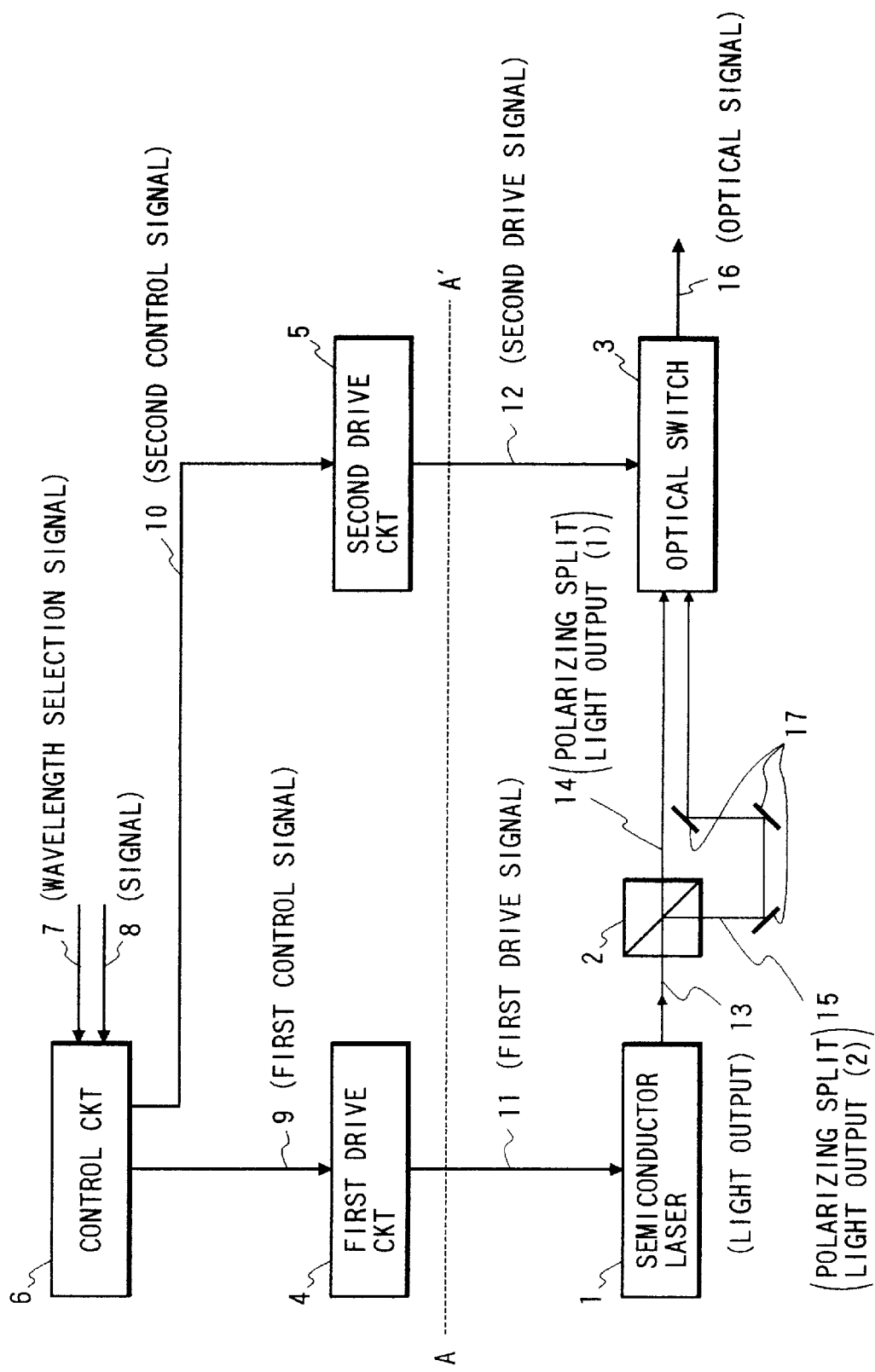
FIG. 3 is a block diagram showing the construction of a first embodiment of the present invention.

FIG. 3 shows the present embodiment by the use of the specific construction of this mode selection means. In FIG. 3, the same members as those in FIG. 2 are given the same reference numerals. In FIG. 3, reference numeral 2 denotes polarizing split means (e.g. a polarizing beam splitter), reference numeral 3 designates an optical switch (which may be a conventional one such as one of the mechanical type moving a prism, a mirror or an optical fiber itself, or one utilizing the electro-optical effect, magneto-optical effect, thermo-optical effect or the like of lithium niobate or the like), reference numeral 12 denotes a second drive signal for mechanically moving a prism or the like and to be applied to an electrode such as a phase modulation type optical switch or a directionality coupler type switch, reference numeral 14 designates a polarizing split light output (1) of one polarized state and a predetermined wavelength, reference numeral 15 denotes a polarizing split light output (2) of the other polarized state and the other predetermined wavelength, and reference numeral 17 designates a mirror.

The semiconductor laser 1 will now be described. The semiconductor laser 1, which has been briefly described above, has the characteristic that the polarization of the output light thereof changes over between the so-called TE mode and the so-called TM mode depending on the excited state thereof. As such a semiconductor laser, there is a laser described, for example, in Japanese Laid-Open Patent Application No. 2-159781. The semiconductor laser shown in Japanese Laid-Open Patent Application No. 2-15978 has the structure of a distributed feedback type semiconductor laser with $\lambda/4$ phase shift, and is formed so that an electrode for injecting an electric current can independently inject an electric current into an activated area including $\lambda/4$ phase shift and the other activated areas. With an electric current moderately injected into each electrode (each area) to oscillate the laser, the electric current being injected into the activated area including $\lambda/4$ phase shift is slightly varied, whereby the polarization mode of the output light can be changed over. In the semiconductor laser of such an operation, the wavelength is changed over simultaneously with the change-over of the polarization mode. That is, in the TE mode, the laser is oscillated at a certain wavelength $\lambda_{TE}$, and in the TM mode, the laser is oscillated at other wavelength $\lambda_{TM}$ ($\lambda_{TE} \neq \lambda_{TM}$)

The optical switch 3 serves to select one of two inputs, and in the case of the present embodiment, it serves to select one of the polarizing split light output (1) 14 and the polarizing split light output (2) 15 as two inputs, and make it into the optical signal 16. The selecting operation of the optical switch 3 is mechanically, electrically or otherwise controlled by the second drive signal 12.

Further, the polarizing split means 2 serves to split lights of two polarization modes capable of being outputted by the semiconductor laser 1, and in the present embodiment, it operates so as to make the light output 13 of the TE mode (wavelength $\lambda_{TE}$) of the semiconductor laser 1 into the polarizing split light output (1) 14 and made the light output 13 of the TM mode (wavelength $\lambda_{TM}$) into the polarizing split light output (2) 15.

Figure 4A:
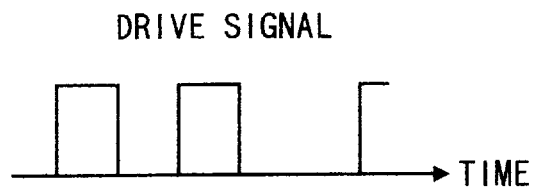
FIGS. 4A to 4C illustrate the operation or characteristic of a semiconductor laser in FIG. 3.
Figure 4B:
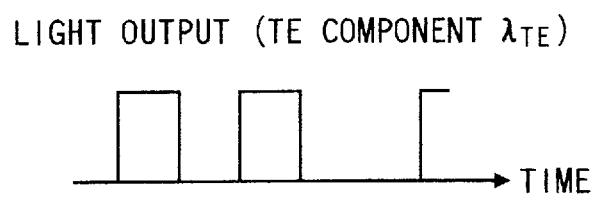
Figure 4C:
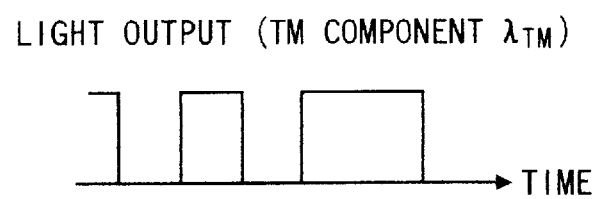

FIGS. 4A to 4C are for illustrating the light outputs when the semiconductor laser 1 has been driven. FIG. 4A shows a signal for driving the semiconductor laser 1 (for example, the electric current injected into the activated area including λ/4 phase shift as described above). FIGS. 4B and 4C show the light outputs classified by the polarization modes of the light output 13 of the semiconductor laser 1. In the case of the present embodiment, for the drive signal of FIG. 4A, the light output of the TE mode is outputted with the same phase (the same signal) as shown in FIG. 4B, and the light output of the TM mode is outputted with the opposite phase (the reversed signal) as shown in FIG. 4C.

FIGS. 5A to 5C are for illustrating drive signals for making the light output waveforms of the TE mode and the TM mode the same.

FIGS. 5A and 5B show drive signals for the TE and TM modes, respectively. FIG. 5C shows an optical signal 16 obtained when the light output, obtained by the semiconductor laser 1, being driven by the signals of FIGS. 5A and 5B, is split into lights of the TE mode and the TM mode and the polarization mode corresponding to FIG. 5A or 5B is selected by the optical switch 3. As shown in FIGS. 5A and 5B, the drive signal for the TE mode and the drive signal for the TM mode are complementary to each other. Even when the semiconductor laser is driven by such signals (FIGS. 5A and 5B), the signal shown in FIG. 5C is obtained as the optical signal 16 due to the characteristic of the semiconductor laser 1 used in the present embodiment described with reference to FIGS. 4A to 4C (when the semiconductor laser is driven by the signal of FIG. 5A, only the TE mode component of the light output 13 is selected by the optical switch 3 and made into the optical signal 16, and when the semiconductor laser is driven by the signal of FIG. 5B, the TM mode component of the light output 13 is selected by the optical switch 3 and made into the optical signal 16).

The operation of the present embodiment will now be described. The wavelength selection signal 7 and the signal 8 are inputted to the control circuit 6. In conformity with the wavelength selection signal 7, the control circuit 6 sets the form of the first control signal 9 produced in conformity with the signal 8 (the form of FIG. 5A or 5B). At the same time, the second control signal 10 is sent to the second drive circuit 5, from which the second drive signal 12 is sent to the optical switch 3, by which the light output 13 of the wavelength (speaking in terms of the polarization mode, TE or TM), indicated by the wavelength selection signal 7, is made into the optical signal 16. In this state, the control circuit 6 delivers the first control signal 9 for the first drive circuit 4 to drive the semiconductor laser 1 by the use of the first drive signal 11 in the form of the signal 8 conforming to the wavelength selection signal 7. As a result of the above-described operation, the light of the wavelength selected by the wavelength selection signal 7 becomes the optical signal 16 conforming to the signal 8 and is delivered from the optical switch 3.

By the operation as described above, the optical signal 16 becomes an intensity modulation signal corresponding to the signal 8. Only by a single polarization modulation semiconductor laser being thus used, the wavelength of the output signal conforming to the wavelength selection signal can be quickly changed over without the light output waveform of the output signal being varied.

Second Embodiment

FIG. 6 shows a second embodiment of the present invention. The embodiment of FIG. 6 is one in which the portions below the line A–A' of FIG. 3 (the semiconductor laser 1, the optical switch 3, etc.) are constructed of other constituent members. In FIG. 6, the same elements as those in FIG. 3 are given the same reference numerals. Here, the new member is an optical bandpass filter designated by reference numeral 18. The optical bandpass filter 18 may be any one of which the transmitted wavelength can be varied from the outside, such as one of the Mach-Zehnder type, one of the Fabry-Perot type, one of the DFB type or one in which filters differing in transmitted wavelength are mechanically changed over.

The difference between the present embodiment and the second mbodiment will now be described. In the first embodiment, the difference in polarization characteristic is used to select a wavelength from the light output 13 (in which two wavelengths are mixed in terms of time) (that is, TE polarization is selected to thereby make the light of the wavelength $\lambda_{TE}$ into an optical signal, or TM polarization is selected to thereby make the light of the wavelength $\lambda_{TM}$ into an optical signal). In the present embodiment, the light output 13 is not split with attention paid to the polarization characteristic, but a wavelength (vertical mode) to be made into an optical signal is directly selected by the use of the optical bandpass filter 18. In the other points, the present embodiment is the same as the first embodiment.

Third Embodiment

Figure 7A:
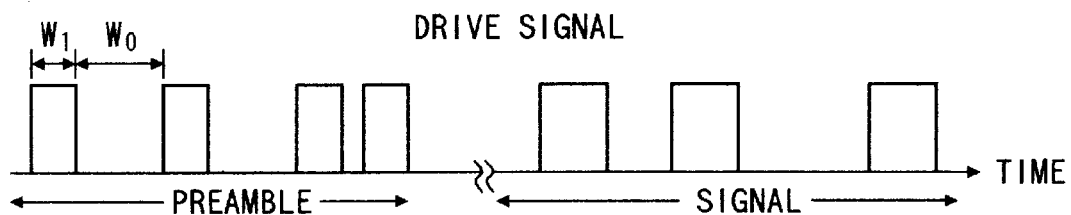
FIGS. 7A to 7C illustrate a third embodiment of the present invention.
Figure 7B:
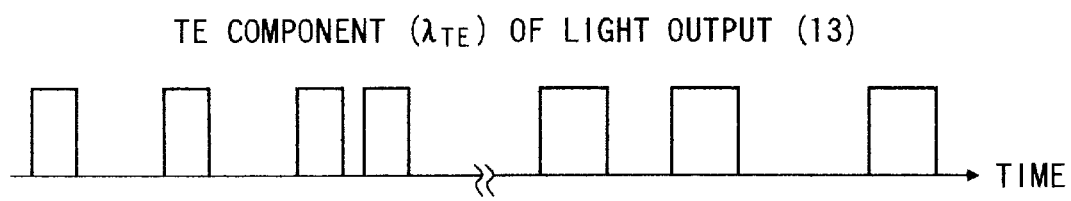
Figure 7C:
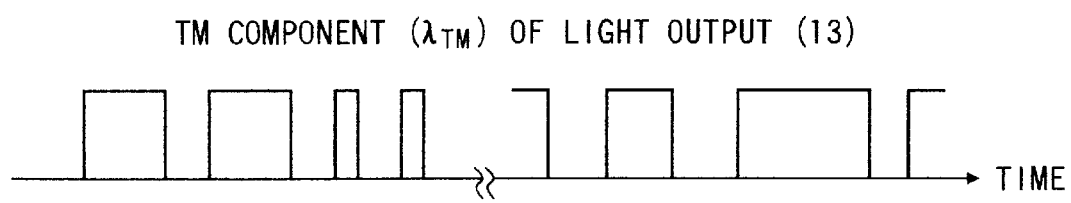

FIGS. 7A to 7C are for illustrating a third embodiment of the present invention. The difference of this embodiment from the first and second embodiments using the construction shown in FIG. 3 or 6 resides in the method of driving the semiconductor laser 1. In the first and second embodiments, the optical signal 16 is basically the same as the signal 8 (see FIG. 5). In the present embodiment, use is made of a driving method in which the drive signal delivered to the semiconductor laser 1 is not changed depending on the wavelength used in transmission.

FIG. 7A shows a signal for driving the semiconductor laser 1. The drive signal 11 comprises a portion corresponding to the signal 8 and a portion (preamble) transmitted to take synchronism prior to it. Here, 101010 . . . 101011 are delivered as the preamble information, but the pulse width ($W_1$) of the drive signal corresponding to "1" and the pulse width ($W_0$) of the drive signal corresponding to "0" differ from each other. In the present embodiment, $W_1:W_0=7:13$. In this case, it will be good if this ratio is not 1:1. The TE component (wavelength $\lambda_{TE}$) and TM component (wavelength $\lambda_{TM}$) of the light output 13 obtained when the semiconductor laser 1 is driven by the drive signal of FIG. 7A are shown in FIGS. 7B and 7C, respectively. The TE component (FIG. 7B) assumes the same waveform as the drive signal (FIG. 7A), and the TM component assumes a waveform in which the drive signal (FIG. 7A) has been reversed.

Such an optical signal (i.e., one of FIGS. 7B and 7C) is received by a receiving device. During the reception, as is usual, the procedure of taking synchronism from the preamble information is carried out and at the same time, the average power of the preamble is detected (in the case of this embodiment, the average power becomes greater when the TM component is being received than when the TE component is being received), whereby it is possible to discriminate whether the transmitted information is the signal shown in FIG. 7B or the signal shown in FIG. 7C (the original signal as it has been reversed). On the basis of the result of this discrimination, the receiving device converts the optical signal 16 into an electrical signal.

Figure 8:
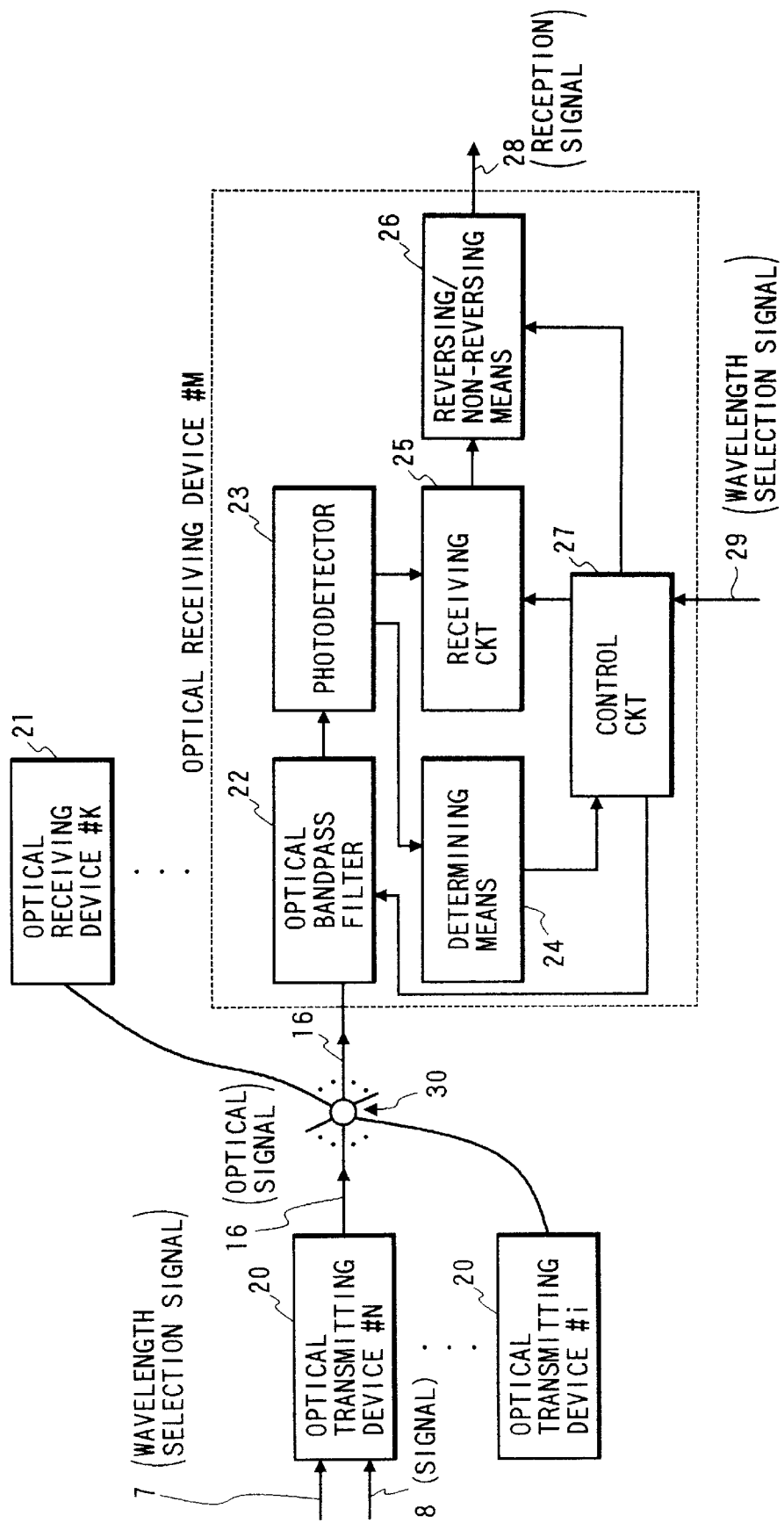
FIG. 8 is a block diagram showing the construction of the third embodiment of the present invention.

FIG. 8 is a diagram showing the construction of an optical receiving device used in the present embodiment. FIG. 8 shows the system in a simplified manner for the sake of illustration. In FIG. 8, reference numeral 20 designates an optical transmitting device, reference numeral 21 denotes an optical receiving device, reference numeral 22 designates an optical bandpass filter, reference numeral 23 denotes a photodetector, reference numeral 24 designate determining means, reference numeral 25 denotes a receiving circuit, reference numeral 26 designates reversing/non-reversing means, reference numeral 27 denotes a control circuit, reference numeral 28 designates a reception signal, reference numeral 29 denotes a wavelength selection signal, and reference numeral 30 designates an optical star coupler. It is to be understood that the optical transmitting device 20 is of the construction used in the first and second embodiments.

The operation of the optical receiving device 21 will now be described. In response to the wavelength selection signal 29 from a terminal apparatus, the control circuit 27 sets the transmitted wavelength of the optical bandpass filter 22 so as to assume a desired value. The optical signal 16 inputted in this state is transmitted through the optical bandpass filter 22 and is received by the photodetector 23 and becomes an electrical signal. The determining means 24 discriminates the transmitted information on the basis of the average value of the preamble, and sends the result thereof to the control circuit 27. The control circuit 27 having obtained the result of the discrimination sends a signal to the reversing/non-reversing means 26 so as to perform one of the reversing operation and the non-reversing operation. The receiving circuit 25 which has received the electrical signal from the photodetector 23 performs a waveform shaping by matching the timing and adjusting the amplitude under the control of the control circuit 27, and sends the signal to the reversing/non-reversing means 26, which applies an operation to the signal by an operation set by the control circuit 27 and makes the signal into the reception signal 28.

The respective means including the determining means 24 shown in the blocks of FIG. 8 are suitably constructed by the use of a conventional technique so as to have the above-described functions.

As described above, according to the variable wavelength light source of the present invention, use is made of a single polarization modulation semiconductor laser stably outputting two wavelengths by the drive means and the mode (such as polarization and vertical mode (wavelength)) selection means, whereby wavelength change-over can be easily realized by a relatively simple construction. Also, an optical frequency shift keying (FSK modulation) laser can be used instead of the polarization modulation laser.

Fourth Embodiment

A fourth embodiment of the present invention will hereinafter be described. FIG. 9 shows the basic construction of the variable wavelength semiconductor laser apparatus according to the present invention, and this apparatus is characterized in that an output polarization change-over element, for selecting the polarization of the output, is provided instead of the polarizer disposed in the output portion of the aforedescribed example of the prior art in which the polarizer, for selecting one of two polarizations, is provided in the output portion of the polarization modulation DFB-LD to obtain an ordinary intensity modulated output. In FIG. 9, reference numeral 901 designates a DFB laser capable of modulating polarization which puts out a polarization modulated light output 903 and which realizes polarization modulation and makes the control of an output polarization wavelength possible by a multielectrode construction. The detailed structure of the DFB laser 901 is as will be described below, and it establishes the mode competition state of two polarizations. Reference numeral 902 denotes an output polarization change-over element which puts out an intensity modulated light output 904 and which is specifically provided with a polarizer and means for rotating it about the optical axis and serves to select only one of the TE mode and the TM mode which are polarizations from the DFB laser 901 orthogonal to each other. Thereby, the wavelength of the intensity modulated light output 904 can be made variable as will be described hereinafter.

The operations of polarization modulation and variable wavelength characteristic will hereinafter be described. FIG. 10 is a graph showing the polarization modulation characteristic of a typical two-electrode DFB-LD, and shows bias currents $I_1$ and $I_2$ applied to two electrodes and TE/TM oscillation areas. The construction of the two electrodes is not symmetrical, but as shown, for example, in FIG. 11, the bias current to an electrode 1116b at an AR 1118 side having one end thereof AR (anti-reflection) coated is $I_2$ and the bias current to an electrode 1116a at a cleavage surface side is $I_1$. On the AR side, a modulation current becomes highly injected and therefore, the carrier to an activated layer 1112 assumes a highly injected state and the increase in the gain on the shorter wavelength side becomes remarkable, and the TM mode becomes dominant.

Figure 12:
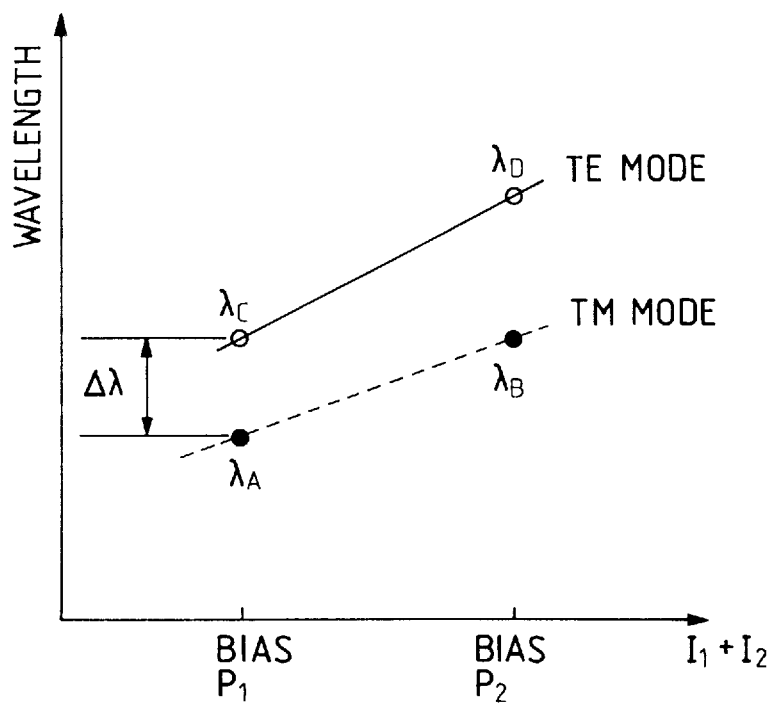
FIG. 12 is a graph showing the state of distribution of the variable wavelength range of TE/TM modes.

The boundary between the two areas of FIG. 10 is an area in which the TE/TM modes compete with each other, and the balance between the two bias currents $I_1$ and $I_2$ is changed, whereby the switching between the two modulations becomes possible. When for example a DC bias is applied to a suitable position (a point marked with X in FIG. 10) between the two areas and a rectangular wave (amplitude $\Delta i_2$) is superimposed on one of the electrode, the modulation of the TE/TM modes becomes possible (the points of marks ○ and ● in FIG. 10). The amplitude $\Delta i_2$ of the modulation current is equal to or less than several mA and there is obtained a modulation output of a high extinction ratio. The oscillation output wavelength difference $\Delta\lambda$ between the two polarizations is of the order of 1 nm. To effect wavelength variation, the DC bias point (mark X) in FIG. 10 can be moved along the transition portion of two polarization areas to thereby accomplish the wavelength variation. In the present device, there is seen the tendency of both of the TE and TM modes to shift to a longer wavelength with an increase in the DC bias. Accordingly, as shown in FIG. 12, the bias movement as described above is effected with respect to $I_1+I_2$ and a modulation current is superimposed thereon and modulated, whereby two variable wavelength ranges can be obtained correspondingly to the two polarizations. By connecting these two wavelength variation areas together and utilizing them, the wavelength variation range of the output can be enlarged.

Figure 13:
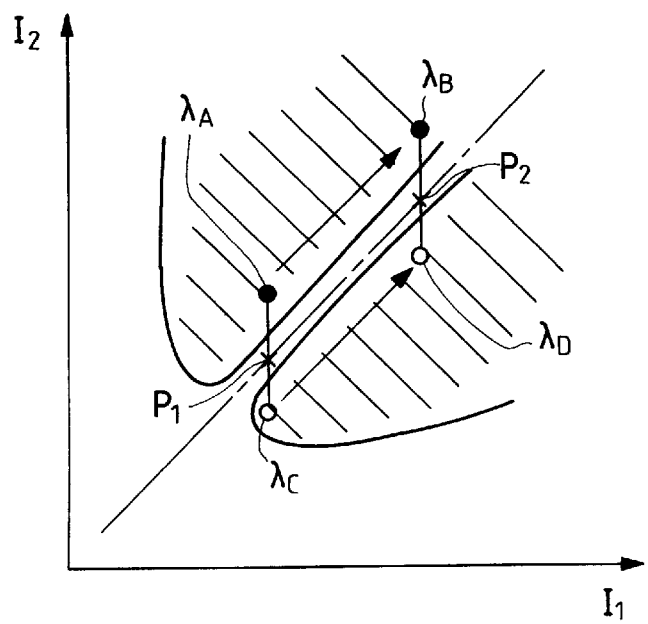
FIG. 13 is a graph showing the change-over of TE/TM modes and a method of shifting a bias point in the wavelength varying operation.

Specifically, in FIG. 13, the bias point is moved from $P_1$ to $P_2$ and TM polarization is first selected, whereby it is made variable from $\lambda_A$ to $\lambda_B$ of FIG. 12, and next the bias point is returned to $P_1$ again and the polarizer of the output polarization change-over element 2 is rotated by 90° to thereby select TE polarization, and the bias point is again moved to the point $P_2$, whereby the wavelength is made variable from $\lambda_C$ to $\lambda_D$ of FIG. 12. By the adoption of the system of the present invention, it becomes possible to enlarge the output wavelength range of an ordinary single fixed polarization to e.g. about two times, and it can be seen that this is very effective for an increase in wavelength division multiplicity.

Figure 11:
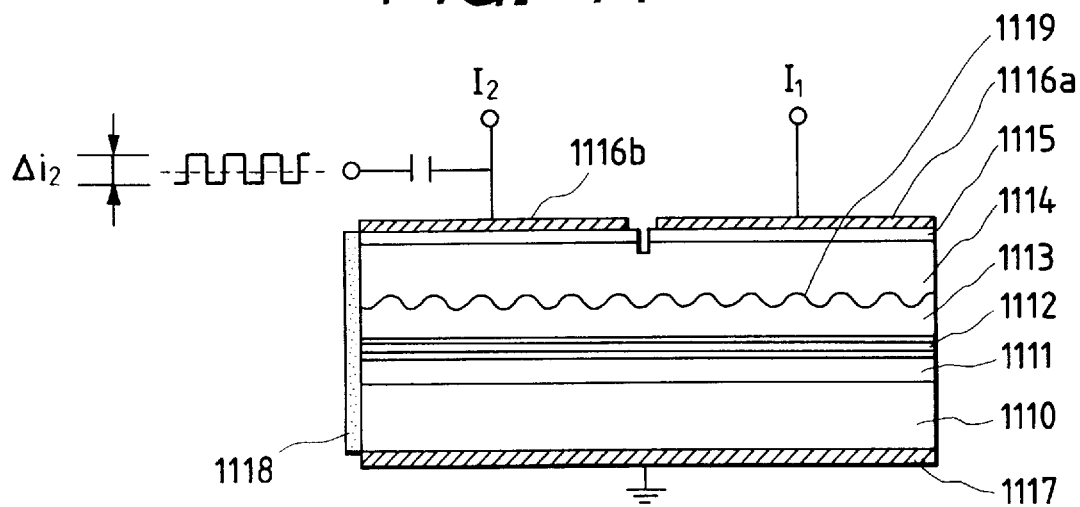
FIG. 11 shows the structure of the polarization modulation semiconductor laser used in the present invention.

The structure and polarization modulation characteristic of an actual DFB type semiconductor laser 1 will hereinafter be described with reference to FIG. 11. Reference numeral 1110 designates an n-InP substrate, reference numeral 1111 denotes an n-InGaAsP waveguide layer, reference numeral 1112 designates a quantum well active layer comprising InGaAs/InGaAsP, reference numeral 1113 denotes a p-InGaAsP waveguide layer, reference numeral 1114 designates a p-InP clad layer, reference numeral 1115 denotes a p$^+$-InGaAs cap layer, the reference characters 1116$a$ and 1116$b$ designate upper electrodes, reference numeral 1117 denotes a lower electrode, reference numeral 1118 designates an SiO$_x$ layer accumulated as AR coating, and reference numeral 1119 denotes a diffraction grating.

Figure 14:
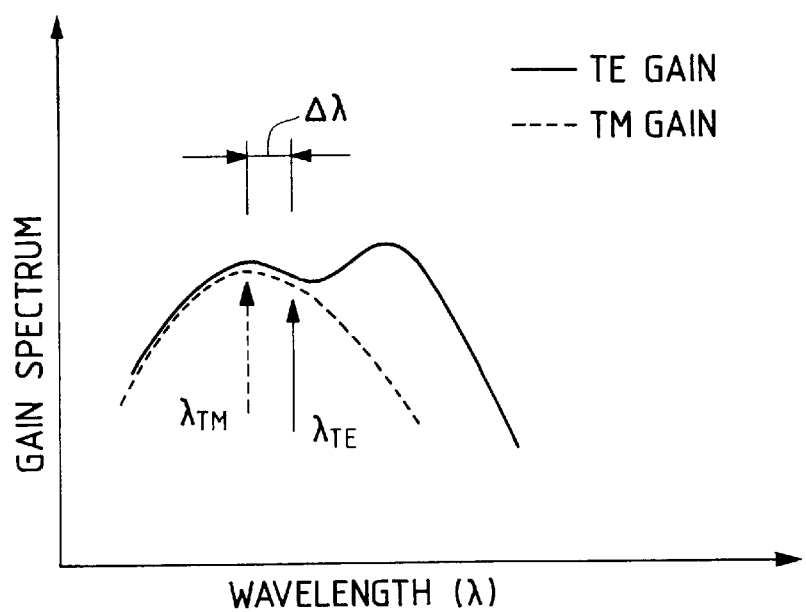
FIG. 14 is a graph showing relation between the gain spectrum and Bragg wavelength of each polarization mode of the polarization modulation semiconductor laser used in the present invention.

The quantum well active layer 1112 comprises an InGaAs well layer and an InGaAsP barrier layer, and has a gain spectrum as shown in FIG. 14. On the longer wavelength side, there is a gain peak by the transition of a heavy hole (hh) of the lowest order level and electrons, and slightly apart therefrom, on the shorter wavelength side, there is a gain peak by the transition of a light hole (lh) which is the next quantum level and electrons. The former has again in the TE mode, and the latter has gains in the TE and TM modes, and there appears again spectrum having polarization dependency as shown in FIG. 14. In order to make polarization modulation possible, a Bragg wavelength is selected in accordance with the gain peak of the TM mode so as to help the oscillation of the TM mode low in gain, and the pitch of the diffraction grating 1119 is determined. Due to the propagation constant difference of the active layer waveguide, there is created the Bragg wavelength difference $\Delta\lambda$ between the TE/TM modes. By the current injecting balance ($I_1$, $I_2$) being varied, the gain spectrum is varied, and the gain of the TM mode which is the high injecting level is greatly varied as compared with the TE mode, and there occurs the competition between the TE/TM modes, and the switching between the two polarizations occurs. The oscillation wavelength difference $\Delta\lambda$ between the two TE/TM modes used in the present invention is determined by the propagation constant difference between the two modes, but it is found that in the same quantum well structure, this difference is of the order of 1–2 nm.

Of course, this oscillation wavelength difference can be variously designed as by forming diffraction gratings differing in period in DFB structures of an oscillator, or introducing different waveguide structures and different quantum well active layers, or introducing a strained super lattice into quantum well structure.

It can be seen that the polarization modulation oscillation wavelength difference between the two modes necessary and sufficient to make the most of the features of the present invention, as is apparent from the example of operation shown in FIG. 12, may be of the order of the wavelength variation range in one polarization so that the wavelength variation ranges in both polarizations may not much overlap each other.

As described above, by using a polarization modulation laser (of any type) and a rotatable polarizer, the wavelength variation range of the light output can be widened as compared with a case where one polarization alone is utilized.

Fifth Embodiment

Figure 15:
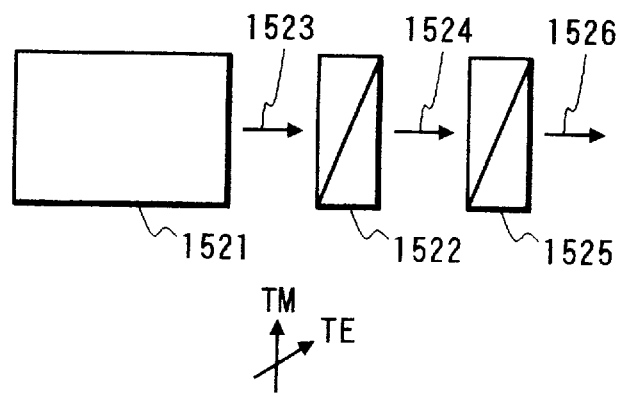
FIG. 15 shows the construction of a fifth embodiment of the present invention in which a polarizing control element in added to an output portion to make a constant polarization output possible.

FIG. 15 shows a fifth embodiment of the present invention. Reference numeral 1521 designates a polarization modulation variable wavelength laser putting out a polarization modulated light output 1523, reference numeral 1522 denotes a polarization change-over element putting out an intensity modulated light output 1524, and reference numeral 1525 designates a polarization control element outputting a light 1526 of a predetermined polarized state. As in the fourth embodiment, the polarization change-over element 1522 can be realized by a polarizer and means for rotating it in a desired direction.

In wavelength division multiplexing optical transmission using the variable wavelength semiconductor laser apparatus of the present invention as a transmitting unit, it is necessary to consider an influence that the transmission polarization state of the transmitting unit has upon a receiving system, and it is desirable that in order to suppress an increase or a decrease in the loss and the fluctuation of characteristic due to the polarization dependency in the receiving system, transmission be effected with constant polarization as much as possible. In the present embodiment, the polarization control element 1525 is further added to the construction of the fourth embodiment so that a constant output polarization state may be provided even if the change-over of polarization is effected by the polarization change-over element 1522. The construction of the polarization control element 1525 can be provided by a combination of a $\lambda/2$ plate and a $\lambda/4$ plate, or by a fiber coil or the like. This polarization control element 1525 is such that for two polarization inputs, change-over is effected in advance at two operation points which become predetermined polarization. When the TE mode light comes from the polarization change-over element 1522, the polarization control element 1525 is set to one operation point, and when the TM mode light comes, the polarization control element 1525 is set to the other operation point. Thus, the light 1526 becomes intensity modulated light assuming a constant polarization state and the wavelength variation range thereof is widened.

Sixth Embodiment

Figure 16:
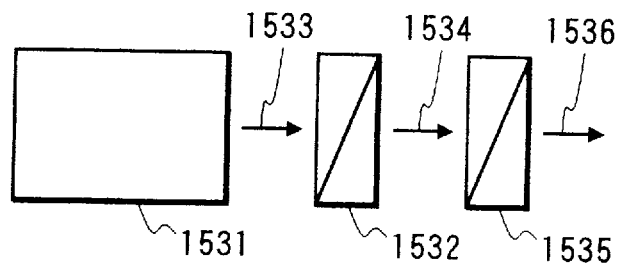
FIG. 16 shows the construction of a sixth embodiment of the present invention in which polarization change-over is constructed of a polarization rotator and a fixed polarizer to make a constant polarization output possible.

FIG. 16 shows a sixth embodiment of the present invention. In this embodiment, a polarizer 1535 for selecting a polarization in a predetermined direction is disposed in the final output portion. Two orthogonal polarizations 1533 outputted from a polarization modulation variable wavelength laser 1531 are intactly outputted or becomes a light 1534 rotated by 90°, by a polarization rotating element 1532. The polarizer 1535 is disposed so as to select a polarization in a predetermined direction and therefore, the output light 1536 thereof is one which has selected the TE mode or the TM mode of the laser 1531. For example, let it be assumed that the polarizer 1535 is set to a state in which it transmits therethrough only the TE mode in the state outputted from the polarization modulation variable wavelength laser 1531. If at this time, the polarization rotating element 1532 is in a state in which it intactly outputs light, the output light 1536 becomes intensity modulated light which has selected the TE mode of the laser 1531. If the polarization rotating element 1532 is in a state in which it rotates the light by 90° and outputs it, it is only the TM mode of the laser 1531 that can be transmitted through the polarizer 1535 and therefore, the output light 1536 becomes intensity modulated light which has selected the TM mode of the laser 1531.

A $\lambda/2$ wavelength plate is simplest as such a polarization rotating element 1532. As other means, a Faraday rotator can also be utilized.

Again in the present embodiment, the output light 1536 becomes intensity modulated light assuming a predetermined polarization state and the wavelength variation range thereof can be widened.

Seventh Embodiment

Figure 17:
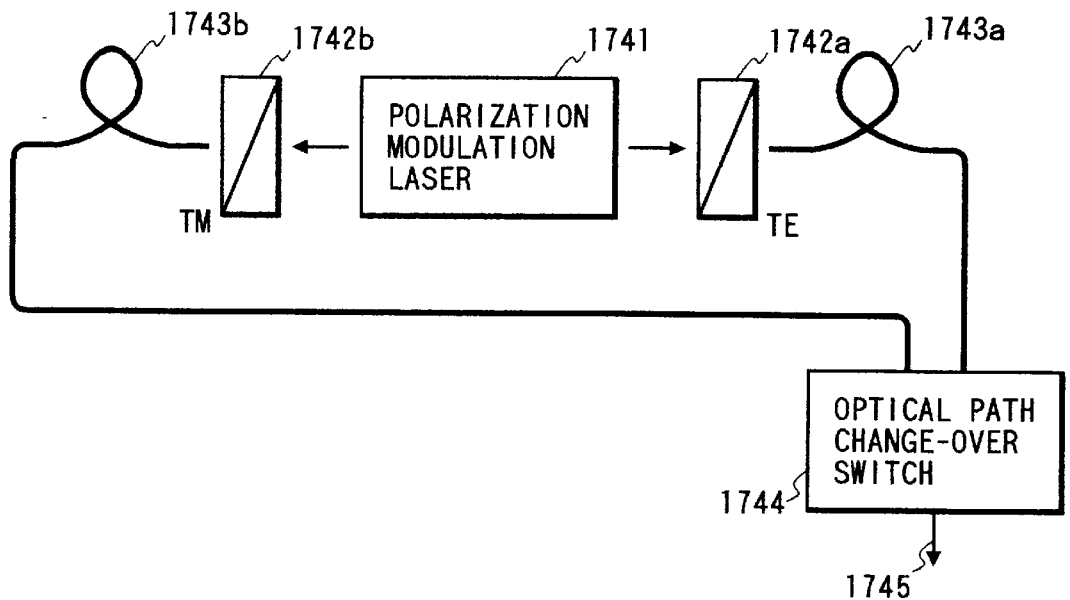
FIG. 17 shows the construction of a seventh embodiment of the present invention having a construction for selectively separating two polarizations and selecting the polarizations by an optical switch.

In this embodiment, two outputs are directly polarization-separated and they are changed over to thereby effect polarization change-over. In FIG. 17, reference numeral 1741 designates a polarization modulation laser, the reference characters 1422a and 1742b denote polarizers, the reference characters 1743a and 1743b designate optical fibers, and reference numeral 1744 denotes an optical path change-over switch. The optical path change-over switch 1744 selects one channel alone and makes it into an output light 1745. In the present embodiment, the polarizers 1742a and 1742b are disposed so as to select different polarization modes with respect to the outputs of the opposite ends of the polarization modulation laser 1741. FIG. 17 is a schematic block diagram in which a lens, etc. for coupling are not shown.

Figure 18:
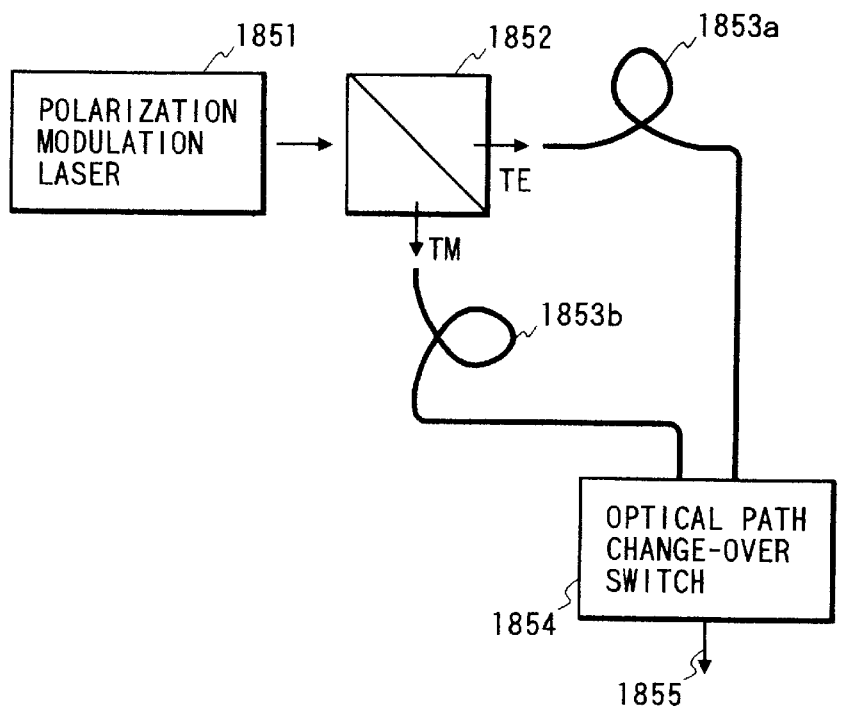
FIG. 18 shows the construction of a modification of the embodiment of FIG. 17.

FIG. 18 shows a variation of the present embodiment in which a polarization separation element 1852 is used in the output portion of a polarization modulation laser 1851 and separates the output light of the laser 1851 into two polarizations and one mode alone is selected by an optical path change-over switch 1854 and is made into an output light 1855. Reference characters 1853a and 1853b designate optical fibers.

In FIGS. 17 and 18, as the optical path change-over switches 1744 and 1854, use may simply be made of movable type switches using an electromagnet to move a movable prism or a movable fiber and besides, for a countermeasure for higher speed, 2×2 switches using a directionality coupler of $LiNbO_3$ (in which, for example, voltages are applied to two waveguides in opposite directions to thereby change the degree of coupling and effect switching).

Eight Embodiment

Figure 19:
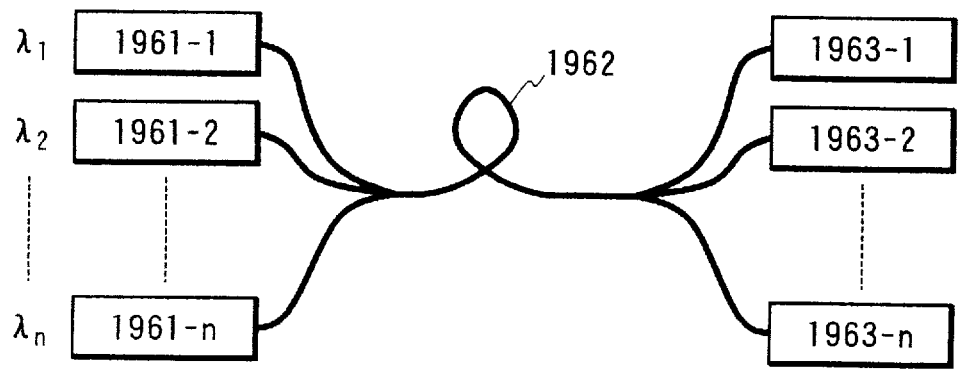
FIG. 19 is a block diagram showing an eighth embodiment of the present invention which uses the device of the present invention in a wavelength division multiplexing transmission system.

FIG. 19 shows an embodiment in which the polarization modulation variable wavelength semiconductor laser apparatus of the present invention is used for wavelength division multiplexing transmission. Reference numerals 1961-1 to 1961-n designate polarization modulation variable wavelength laser apparatuses which are set to the wavelengths of 11 channels delivering different wavelengths. Reference numeral 1962 denotes an optical fiber, and reference numerals 1963-1 to 1963-n designate receivers for dividing and detecting a wavelength-multiplex optical signal, and it becomes possible to individually select and receive each channel. A device such as an etalons-type filter is used as a wavelength divider or a wavelength filter, whereby a desired selection width is obtained and thus, wavelength division multiplexing transmission suffering little from cross talk is realized.

Figure 20:
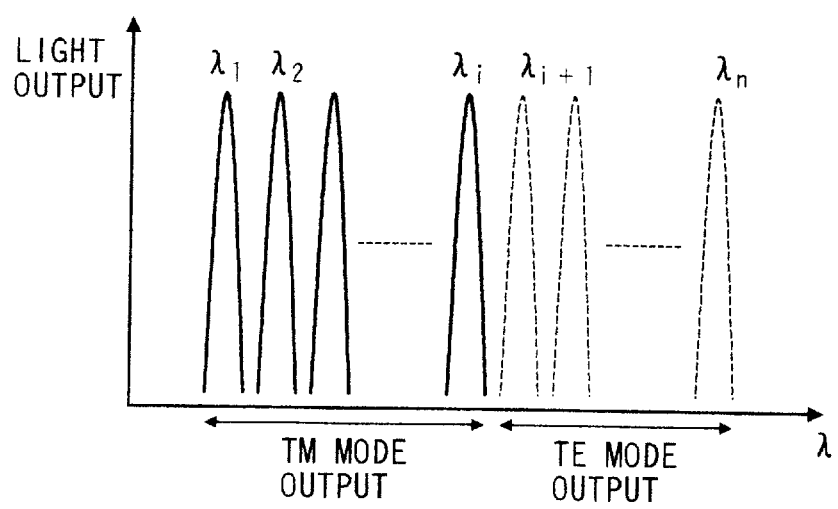
FIG. 20 is an illustration of the disposition of wavelength multiplex channels in the eighth embodiment.

FIG. 20 shows an example of the wavelength multiplex channel used in an embodiment of the present invention. On the shorter wavelength side, the TM mode output is utilized up to $\lambda_1, \lambda_2, \ldots, \lambda_i$, and there are 10 channels at each 0.1 nm, and on the longer wavelength side, the TE mode is utilized up to $\lambda_{i+1}, \ldots, \lambda_n$, and there are also 10 channels at each 0.1 nm and thus, wavelength multiplexing of 20 channels in total is realized. In each channel, intensity modulated signals of $\lambda_1, \lambda_2, \ldots, \lambda_{20}$ are sent. The wavelength variation range is more or less irregular from one device to another, but could generally be set to a range centering around $\lambda = 1.550$ μm.

While in the present embodiment, the star type has been shown as the form of a wavelength division multiplexing network, this is illustrative of the wavelength division multiplexing system to the last and of course, the present embodiment can be adopted in a network of the bus type, the ring type or the like.

As described above, according to the present invention, in an optical transmitting system for transmitting an intensity modulated signal by the use of a polarization modulation laser, the other polarization which could heretofore not be utilized in fixed output polarization is utilized effectively by selective change-over, whereby there is obtained the effect that the wavelength variation range can be utilized within the variation range of two polarization modes and an increase in wavelength multiplicity or the like can be achieved.

Although in the fourth embodiment and succeeding embodiments, the variation in phase resulting from a change of the output light to be selected is not particularly described, there can be adopted a construction in which as in the first to third embodiments, a discrimination signal is sent from the transmitting side so that the phase of a modulation signal to be supplied may be controlled or which output light is selected by the transmitting side can be discriminated on the receiving side. Also, there can be adopted such a modulation system and/or a demodulation system that the reversal of the phase does not affect demodulation. Also, when a signal is being transmitted, the setting is done so as not to change the output light to be selected, and when reproduction timing is to be extracted each time the signal is reproduced, such a construction is not necessary.

What is claimed is:

1. A variable wavelength light source comprising:
   (a) a semiconductor laser comprising:
      a substrate,
      a plurality of semiconductor layers laminated on the substrate, said plurality of semiconductor layers including an active layer and constituting a laser resonator,
      a diffraction grating periodically formed along a resonance direction of said laser resonator, and
      a plurality of electrodes for injecting current into said semiconductor layers, said plurality of electrodes being arranged in tandem in the resonance direction,
      wherein said semiconductor laser selectively outputs either one of light of a first polarization mode having a predetermined wavelength and polarized in a predetermined direction and light of a second polarization mode having a wavelength different from that of said first polarization mode light and polarized in a direction orthogonal to said predetermined direction in correspondence to an amount of current injected from at least one of said plurality of electrodes; and
   (b) a light selecting element for switchably selecting either one of said first and second polarization mode light which are outputted from said semiconductor laser.

2. A variable wavelength light source according to claim 1, wherein said light selecting element comprises a polarizing beam splitter for separating said first and second polarization mode light outputted from said semiconductor laser from each other, and an optical switch for selectively outputting either one of said first and second polarization mode light separated by said polarizing beam splitter.

3. A variable wavelength light source according to claim 1, wherein said light selecting element comprises an optical bandpass filter adapted to change a transmission wavelength therethrough.

4. A variable wavelength light source according to claim 1, wherein said light selecting element comprises a polarizer, and means for rotating said polarizer about an optical axis of the light outputted from said semiconductor laser.

5. A variable wavelength light source according to claim 1, wherein said light selecting element comprises a polarizer for transmitting therethrough either one of the light polarized in said predetermined direction and the light polarized in the direction orthogonal to said predetermined direction, and a polarization rotating element, disposed between said semiconductor laser and said polarizer, for selectively assuming a state in which the light outputted from said semiconductor is guided to said polarizer without changing the polarization direction of the light and a state in which the light outputted from said semiconductor laser is guided to said polarizer with rotating the polarization direction of the light by 90 degrees.

6. A variable wavelength light source according to claim 1, wherein said semiconductor laser outputs light from opposite end portions thereof, and said light selecting element comprises a first polarizer for extracting only the light polarized in said predetermined direction among the light outputted from one end portion of said semiconductor laser, a second polarizer for extracting only the light polarized in the direction orthogonal to said predetermined direction among the light outputted from the other end portion of said semiconductor laser, and an optical switch for selectively outputting either one of the light extracted by said first polarizer and the light extracted by said second polarizer.

7. A variable wavelength light source according to claim 1 further comprising a polarization controlling element for polarization change such that the polarization direction of the first polarization mode light outputted from said light selecting element is coincident with the polarization direction of the second polarization mode light outputted from said light selecting element.

8. A variable wavelength light source according to any one of claims 1 to 6 further comprising a first drive circuit for driving said semiconductor laser, a second drive circuit for driving said light selecting element, and a control circuit for controlling said first and second drive circuits.

9. A variable wavelength light source according to claim 8, wherein a information signal and a wavelength selection signal are inputted to said control circuit which then outputs to said second drive circuit a second control signal instructing which polarization mode light of the first and second polarization mode light is selected in accordance with said wavelength selection signal, and said second drive circuit drives said light selecting element in accordance with said second control signal, and wherein said control circuit outputs, in accordance with said wavelength selection signal, to said first drive circuit, a modulation signal having the same phase as said information signal and a modulation signal having a phase opposite to that of said information signal as a first control signal, and said first drive circuit drives said semiconductor laser in accordance with said first control signal.

10. A variable wavelength light source according to any one of claims 1 to 6, wherein said semiconductor laser includes first and second electrodes arranged in tandem in the resonance direction, and current, according to a signal in which a modulation signal is superimposed on a bias signal, is injected from said second electrode into the semiconductor layers so that said semiconductor laser outputs light modulated in accordance with said modulation signal between said first polarization mode and said second polarization mode.

11. A variable wavelength light source according to claim 10, wherein an amount of current in correspondence to the bias signal, injected into the semiconductor layers from said second electrode is varied so that the respective wavelengths of said first and second polarization mode light outputted from said semiconductor laser are varied.

12. A variable wavelength light source according to any one of claims 1 to 6, wherein said semiconductor laser includes first and second electrodes arranged in tandem in the resonance direction.

13. A method of driving a variable wavelength light source comprising (a) a semiconductor laser comprising a substrate, a plurality of semiconductor layers laminated on the substrate, the plurality of semiconductor layers including an active layer and constituting a laser resonator, a diffraction grating periodically formed along a resonance direction of the laser resonator, and a plurality of electrodes for injecting current into the semiconductor layers, the plurality of electrodes being arranged in tandem in the resonance direction, wherein the semiconductor laser selectively outputs either one of light of a first polarization mode having a predetermined wavelength and polarized in a predetermined direction and light of a second polarization mode having a wavelength different from that of the first polarization mode light and polarized in a direction orthogonal to the predetermined direction in correspondence to an amount of current injected from at least one of the plurality of electrodes, and first and second electrodes arranged in tandem in the resonance direction, and (b) a light selecting element for switchably selecting either one of the first and second polarization mode light which are outputted from the semiconductor laser, said method comprising the steps of:

injecting current, according to a signal in which a modulation signal is superimposed on a bias signal, into the semiconductor layers from the second electrode, and thereby outputting light modulated in accordance with the modulation signal between the first and second polarization modes from the semiconductor laser; and varying an amount of current, according to the bias signal, to be injected into the semiconductor layers from the second electrode, and thereby varying the respective wavelengths of the first and second polarization mode light outputted from the semiconductor laser.

14. A method of driving a variable wavelength light source comprising (a) a semiconductor laser comprising a substrate, a plurality of semiconductor layers laminated on the substrate, the plurality of semiconductor layers including an active layer and constituting a laser resonator, a diffraction grating periodically formed along a resonance direction of the laser resonator, and a plurality of electrodes for injecting current into the semiconductor layers, the plurality of electrodes being arranged in tandem in the resonance direction, wherein the semiconductor laser selectively outputs either one of light of a first polarization mode having a predetermined wavelength and polarized in a predetermined direction and light of a second polarization mode having a wavelength different from that of the first polarization mode light and polarized in a direction orthogonal to the predetermined direction in correspondence to an amount of current injected from at least one of the plurality of electrodes and (b) a light selecting element for switchably selecting either one of the first and second polarization mode light which are outputted from the semiconductor laser, said method comprising the steps of:

selecting either one of the first and second polarization mode light with the light selecting element; and in correspondence to the polarization mode of light selected by the light selecting element selected in said selecting step, driving the semiconductor laser in accordance with either one of a modulation signal having the same phase as an information signal and the modulation signal having a phase opposite to that of the information signal.

15. An optical communication system comprising:

a variable wavelength light source comprising:
  (a) a semiconductor laser comprising:
    a substrate,
    a plurality of semiconductor layers laminated on the substrate, said plurality of semiconductor layers including an active layer and constituting a laser resonator,
    a diffraction grating periodically formed along a resonance direction of said laser resonator, and
    a plurality of electrodes for injecting current into said semiconductor layers, said plurality of electrodes being arranged in tandem in the resonance direction,
    wherein said semiconductor laser selectively outputs either one of light of a first polarization mode having a predetermined wavelength and polarized in a predetermined direction and light of a second polarization mode having a wavelength different from that of said first polarization mode light and polarized in a direction orthogonal to said predetermined direction in correspondence to an amount of current injected from at least one of said plurality of electrodes; and
  (b) a light selecting element for switchably selecting either one of said first and second polarization mode light which are outputted from said semiconductor laser;

an optical transmitter for transmitting the light selected by said light selecting element as an optical signal; and an optical receiver for receiving the optical signal transmitted from said optical transmitter.

* * * * *

UNITED STATES PATENT AND TRADEMARK OFFICE
CERTIFICATE OF CORRECTION

PATENT NO. : 5,862,165

DATED : January 19, 1999

INVENTOR(S) : Yuichi HANDA, et al.

It is certified that error appears in the above-identified patent and that said Letters Patent is hereby corrected as shown below:

Column 5
    Line 20, "in" should read --is--.

Column 6
    Line 36, "No. 2-15978" should read --No. 2-159781--.
    Line 51, $\lambda_{TM}(\lambda_{TE} \neq \lambda_{TM})$" should read --$\lambda_{TM}(\lambda_{TE} \neq \lambda_{TM}).$--.

Column 9
    Line 8, "designate" should read --designates--.

Column 12
    Line 44, "becomes" should read --become--.

Column 15
    Line 31, "1" should read --1,--.
    Line 38, "claims 1 to 6" should read --claims 1 to 6,--
    Line 43, "a" (first occurrence) should read --an--.

Signed and Sealed this

Twenty-sixth Day of October, 1999

Attest:

Q. TODD DICKINSON

*Attesting Officer*   *Acting Commissioner of Patents and Trademarks*